(12) United States Patent
Kim (10) Patent No.: US 10,571,740 B2
(45) Date of Patent: Feb. 25, 2020

(54) QUANTUM DOT SHEET OF FIBROUS-WEB STRUCTURE, MANUFACTURING METHOD THEREOF, AND BACKLIGHT UNIT

(71) Applicant: AMOGREENTECH CO., LTD., Gimpo (KR)

(72) Inventor: Ju Hyung Kim, Incheon (KR)

(73) Assignee: AMOGREENTECH CO., LTD., Gimpo (KR)

( * ) Notice: Subject to any disclaimer, the term of this patent is extended or adjusted under 35 U.S.C. 154(b) by 22 days.

(21) Appl. No.: 15/744,785

(22) PCT Filed: Jul. 12, 2016

(86) PCT No.: PCT/KR2016/007555
§ 371 (c)(1),
(2) Date: Jan. 13, 2018

(87) PCT Pub. No.: WO2017/010788
PCT Pub. Date: Jan. 19, 2017

(65) Prior Publication Data
US 2018/0203302 A1  Jul. 19, 2018

(30) Foreign Application Priority Data

Jul. 13, 2015 (KR) .................. 10-2015-0099367
Jul. 23, 2015 (KR) .................. 10-2015-0104501

(51) Int. Cl.
*G02F 1/1335* (2006.01)
*F21V 8/00* (2006.01)
(Continued)

(52) U.S. Cl.
CPC ...... *G02F 1/133603* (2013.01); *C08L 101/00* (2013.01); *G02B 6/0003* (2013.01); *G02F 1/133606* (2013.01); *H01L 33/501* (2013.01); *H01L 33/502* (2013.01); *H01L 33/505* (2013.01); *C08K 2201/011* (2013.01); *G02B 6/0055* (2013.01);
(Continued)

(58) Field of Classification Search
None
See application file for complete search history.

(56) References Cited

U.S. PATENT DOCUMENTS

2012/0097832 A1  4/2012  Moran-Mirabal et al.
2013/0308334 A1  11/2013  Davis et al.
(Continued)

FOREIGN PATENT DOCUMENTS

WO  2009145500 A2  12/2009

OTHER PUBLICATIONS

Woo et al. (Enhanced Photoluminance of Layered Quantum dot-Phosphor Nanocomposites as Converting Materials for Light Emitting Diodes, J. Phys. Chem. C, 2011, 115, 20945-20952 (Year: 2011).*

(Continued)

*Primary Examiner* — Alexandre F Ferre
(74) *Attorney, Agent, or Firm* — Bayramoglu Law Offices LLC (57) ABSTRACT

A quantum dot sheet having a fibrous-web structure, including a quantum dot layer having a three-dimensional network structure formed by an aggregate of nanofibers. The nanofibers include quantum dots.

13 Claims, 4 Drawing Sheets (51) Int. Cl.
*C08L 101/00* (2006.01)
*H01L 33/50* (2010.01)

(52) U.S. Cl.
CPC ............ *G02F 2001/133607* (2013.01); *G02F 2001/133614* (2013.01); *G02F 2202/36* (2013.01); *H01L 33/507* (2013.01)

(56) References Cited

U.S. PATENT DOCUMENTS

2013/0309519 A1 11/2013 Hinestroza et al.
2014/0192291 A1 7/2014 Kang et al.

OTHER PUBLICATIONS

Machine translation WO 2009/145500 (Year: 2009).*

* cited by examiner

QUANTUM DOT SHEET OF FIBROUS-WEB STRUCTURE, MANUFACTURING METHOD THEREOF, AND BACKLIGHT UNIT

CROSS REFERENCE TO RELATED APPLICATIONS

This application is the national phase entry of International Application No. PCT/KR2016/007555, filed on Jul. 12, 2016, which claims priority from the Korean patent application no. 10-2015-0099367 filed on Jul. 13, 2015, and the Korean patent application no. 10-2015-0104501 filed on Jul. 23, 2015, the entire contents of which are incorporated herein by reference.

TECHNICAL FIELD

The present disclosure relates to an image display apparatus, and more particularly, to a quantum dot sheet having a fibrous-web structure for a quantum dot display, a method of manufacturing the same, and a backlight unit including the quantum dot sheet.

BACKGROUND

In general, a backlight unit (BLU) is a light source device disposed behind a liquid crystal screen to emit light to the liquid crystal screen such as a liquid crystal display (LCD), and uses light emitting diodes (LEDs) as a light source. When LEDs are used as a light source, the backlight unit uses a red (R) or green (G) fluorescent material on a blue (B) LED chip to emit white light.

Figure 1:
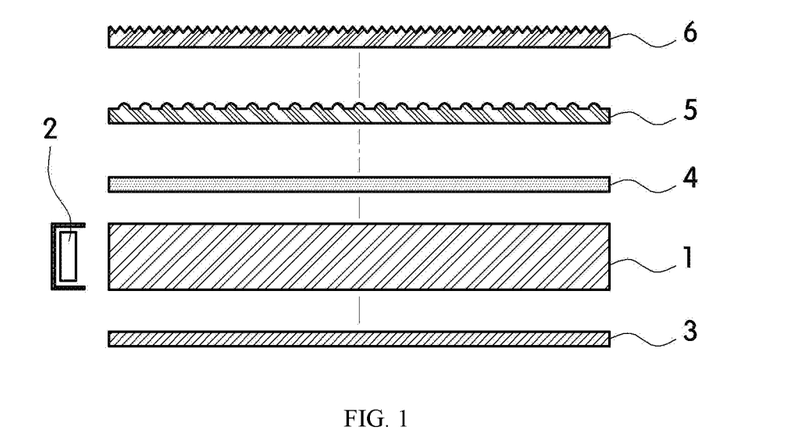
FIG. 1 is a schematic sectional view illustrating a backlight unit that adopts a conventional quantum dot sheet.

Recently, a backlight unit configured to emit white light using a quantum dot sheet 4 has been proposed (see FIG. 1). Since white light realized through the quantum dot sheet has excellent color expression in comparison to white light realized through existing blue LED chips and fluorescent materials, production of backlight units using the quantum dot sheet is gradually increasing.

Generally, as schematically shown in FIG. 1, a backlight unit that adopts a quantum dot sheet includes a light guide plate 1, an LED light source 2 disposed on a side surface of the light guide plate 1, a reflective plate 3 disposed under the light guide plate 1, and a quantum dot sheet 4, a diffusion sheet 5, and a prism sheet 6 sequentially laminated on the light guide plate, so that the backlight unit may emit white light.

Figure 2:
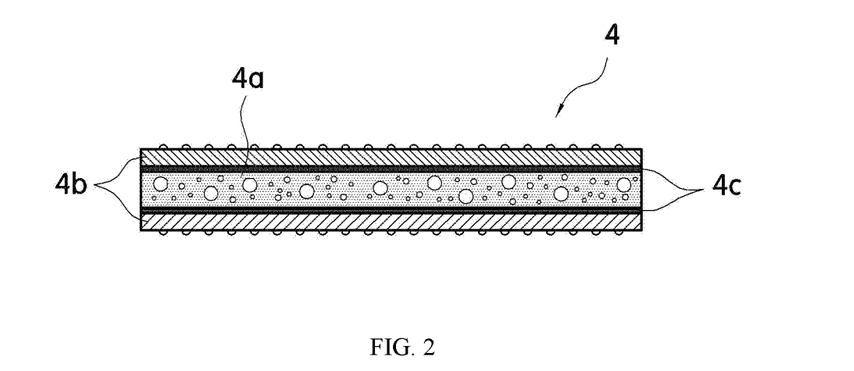
FIG. 2 is a schematic sectional view illustrating the conventional quantum dot sheet.

For example, when the LED light source 2 is a B LED, the quantum dot sheet 4 including quantum dots configured to emit R and G light is used. Referring to FIG. 2, the quantum dot sheet 4 includes a quantum dot layer 4a in which quantum dots are distributed and barrier layers 4b configured to cover upper and lower surfaces of the quantum dot layer 4a. The barrier layers 4b block moisture and air from entering the quantum dot layer 4a, and the quantum dot sheet 4 has a structure in which the barrier layers 4b are adhered to the upper and lower surfaces of the quantum dot layer 4a, and adhesive layers 4c are additionally provided between the quantum dot layer 4a and the barrier layers 4b. The adhesive layer 4c decreases light transmittance and light efficiency, and a manufacturing process is complicated, and thus manufacturing cost is increased.

In addition, in the quantum dot sheet 4, after the quantum dot layer 4a is formed, the quantum dot layer 4a comes into contact with air and is oxidized in a process of bonding the barrier layers 4b to the upper and lower surfaces of the quantum dot layer 4a, and the thickness of the quantum dot layer becomes thick, which makes it difficult to form the quantum dot sheet 4 into a slim structure, such that the volume and/or a thickness of the backlight unit is increased.

Further, the existing quantum dot sheet 4 may have entangled or aggregated quantum dots in the quantum dot layer 4a, such that intrinsic properties of the quantum dots are degraded, and a defect of light being unable to be uniformly emitted may frequently occur. In order to solve this problem, the quantum dot layer 4a has to contain more quantum dots than a required reference value, which results in increasing the manufacturing cost of the quantum dot sheet.

Therefore, it is necessary to develop a new quantum dot sheet in which blue light can be converted into white light with high efficiency so that the quantum dot sheet has superior color reproducibility and a slim structure.

SUMMARY

The present disclosure is directed to providing a quantum dot sheet having a fibrous-web structure, in which fibers including quantum dots are formed into a web having a three-dimensional network structure, so that white light may be realized with a small amount of quantum dots, and the quantum dot sheet may substitute for a diffusion sheet (or a diffusion film) in a backlight unit.

In addition, the present disclosure is directed to providing a method of manufacturing the quantum dot sheet having the fibrous-web structure with high productivity.

Further, the present disclosure is directed to providing a backlight unit (BLU) having a reduced thickness, in which the quantum dot sheet is adopted to remove a diffusion sheet (or a diffusion film).

Moreover, the present disclosure is directed to providing a liquid crystal display (LCD), a light emitting diode (LED) display, and an LED lighting device having superior color reproducibility, in which the BLU is adopted.

According to one aspect of the present disclosure, a quantum dot sheet having a fibrous-web structure includes a quantum dot layer having a three-dimensional network structure formed by an aggregate of nanofibers including quantum dots.

The quantum dot sheet having the fibrous-web structure may further include a fluorescent substance in the three-dimensional network structure.

The quantum dot sheet having the fibrous-web structure may have a single-layer structure composed of a quantum dot layer.

The quantum dot sheet having the fibrous-web structure may further include a support layer or a barrier layer disposed downstream of the quantum dot layer when viewed from a light transmission direction.

The quantum dot sheet having the fibrous-web structure may further include a barrier layer disposed upstream of the quantum dot layer when viewed from the light transmission direction.

The nanofibers may include: quantum dots; and a polymer resin, wherein the nanofibers may include 1 to 6 parts by weight of the quantum dots based on 100 parts by weight of the polymer resin.

The quantum dot layer may be formed to have the three-dimensional network structure by forming an aggregate in which the nanofibers are laminated by electrospinning or electrospraying a mixed solution including the quantum dots and the polymer resin.

The quantum dot layer may include: quantum dots; a fluorescent substance; and a polymer resin, wherein the nanofibers may include 0.5 to 5 parts by weight of the quantum dots based on 100 parts by weight of the polymer resin.

The quantum dot layer may include 10 to 20 parts by weight of the fluorescent substance based on 100 parts by weight of the polymer resin.

The quantum dot layer may be formed to have the three-dimensional network structure by forming an aggregate in which the nanofibers are laminated by electrospinning or electrospraying a mixed solution including the quantum dots, the fluorescent substance, and the polymer resin.

The quantum dots may include at least one type of quantum dot selected from: a red-based quantum dot having a photoluminescence (PL) wavelength peak of 600 nm to 750 nm; a yellow-based quantum dot having a PL wavelength peak of 550 nm to 600 nm; and a green-based quantum dot having a PL wavelength peak of 490 nm to 530 nm.

The quantum dot layer may include the red-based quantum dots and the green-based quantum dots in a weight ratio of 1:2 to 1:4.

The quantum dot layer may include the red-based quantum dots and the yellow-based quantum dots in a weight ratio of 1:0.8 to 1:2.5.

The fluorescent substance may include at least one selected from among a silicate-based fluorescent substance, a sulfide-based fluorescent substance, a nitrate-based fluorescent substance, a nitride-based fluorescent substance, and an aluminate-based fluorescent substance.

The quantum dot layer may include the red-based quantum dots and the green-based quantum dots in a weight ratio of 1:10 to 1:40.

The nanofibers of the quantum dot layer may be coated with a barrier material.

The barrier layer may be formed upstream of the quantum dot layer through spray-coating or spin-coating.

The support layer and the barrier layer may include the same resin as the polymer resin constituting the quantum dot layer, and the barrier layer may be in the form of a sheet, a film, or a coating layer.

The nanofibers may have an average particle diameter of 200 nm to 1,000 nm, the quantum dots may have an average particle diameter of 1 nm to 50 nm, and the quantum dot layer may have an average thickness of 3 μm to 100 μm.

The fluorescent substance may have an average particle diameter of 2,000 nm to 30,000 nm.

In the quantum dot sheet having the fibrous-web structure, when a color coordinate of an area of 1.5 mmØ in the quantum dot sheet is measured by using a color coordinate system measurement device under conditions in which a distance between a blue light source and the quantum dot sheet is 0.5 m and a measurement angle is 0.2°, a CIE x value and a CIE y value may satisfy color coordinate values of the following Expressions 1 and 2:

$$0.25 \leq \text{CIE } x \leq 0.35; \text{ and} \quad \text{[Expression 1]}$$

$$0.30 \leq \text{CIE } y \leq 0.40. \quad \text{[Expression 2]}$$

The quantum dot sheet having the fibrous-web structure may have a color reproduction rate of 100% or more and a luminance of 4,600 cd/m$^2$ or more on the basis of a 100% NTSC color gamut based on CIE 1931 color coordinates.

According to another aspect of the present disclosure, a method of manufacturing a quantum dot sheet having a fibrous-web structure includes: a first step of preparing a mixed solution including a quantum dot dispersion solution containing quantum dots, a polymer resin, and a solvent; a second step of forming an aggregate in which nanofibers are laminated by electrospinning or electrospraying the mixed solution on a top surface of a support layer or a barrier layer; and a third step of drying the aggregate in which the nanofibers are laminated to form a quantum dot layer having a three-dimensional network structure.

The mixed solution prepared in the first step may further include a fluorescent substance.

The method of manufacturing the quantum dot sheet having the fibrous-web structure may further include a fourth step of laminating a barrier layer on one surface of the quantum dot layer.

The method of manufacturing the quantum dot sheet having the fibrous-web structure may further include, after the third step or the fourth step, separating the quantum dot layer from the support layer formed under the quantum dot layer or from the barrier layer.

According to still another aspect of the present disclosure, a backlight unit includes various types of quantum dot sheets having the fibrous-web structures as described above.

The backlight unit may not include a diffusion sheet (or a diffusion film) as a component, and may include a light guide plate, the quantum dot sheet, and a prism sheet.

The quantum dot sheet and the prism sheet may be sequentially laminated on a top surface of the light guide plate.

The backlight unit may further include a reflective plate disposed on a bottom surface of the light guide plate.

According to yet another aspect of the present disclosure, a light emitting diode (LED) lighting device includes various types of quantum dot sheets having the fibrous-web structures as described above.

According to yet another aspect of the present disclosure, a display device such as a liquid crystal display (LCD) and a light emitting diode (LED) includes the backlight unit.

According to the present disclosure, there is provided a web-type quantum dot sheet in which a fibrous aggregate has a three-dimensional network structure, different from a conventional plate-type quantum dot sheet, in which light is diffuse-reflected because of a structure and a form of the web-type quantum dot sheet, so that a volume and/or a thickness of a backlight unit (BLU) can be reduced by omitting the application of a diffusion sheet during manufacture of the BLU, quantum dots can be uniformly dispersed, degradation of the quantum dots can be decreased, it is possible to emit white light through the BLU while using less quantum dots than those of a conventional quantum dot sheet, and high color reproducibility can be implemented. In addition, since the quantum dot sheet of the present disclosure has the fibrous-web structure, the quantum dot sheet has excellent in flexibility, such that the quantum dot sheet can be applied to a flexible display, a flexible lighting device, or the like.

| Description of Reference numerals: | |
| --- | --- |
| 1: Light guide plate (or Light guide sheet) | 2: Light source |
| 3: Reflective plate | 5: Diffusion sheet |
| 6: Prism sheet | 11: Quantum dot layer |
| 13: Fluorescent substance | 15: Quantum dot |
| 17: Support layer | 19: Barrier layer |
| 4, 100: Quantum dot sheet | |

DETAILED DESCRIPTION OF THE INVENTION

The term "layer" or "sheet" used herein is meant to include all forms of a sheet, a film, and a plate unless described otherwise.

Hereinafter, exemplary embodiments of the present disclosure will be described in detail with reference to the accompanying drawings such that those skilled in the art may easily implement the embodiments. The present disclosure may be implemented in various forms, but is not limited to the exemplary embodiments described herein. In the drawings, portions irrelevant to the description will not be shown in order to make the present disclosure clear, and same reference numerals refer to same or like elements throughout the specification.

Figure 3:
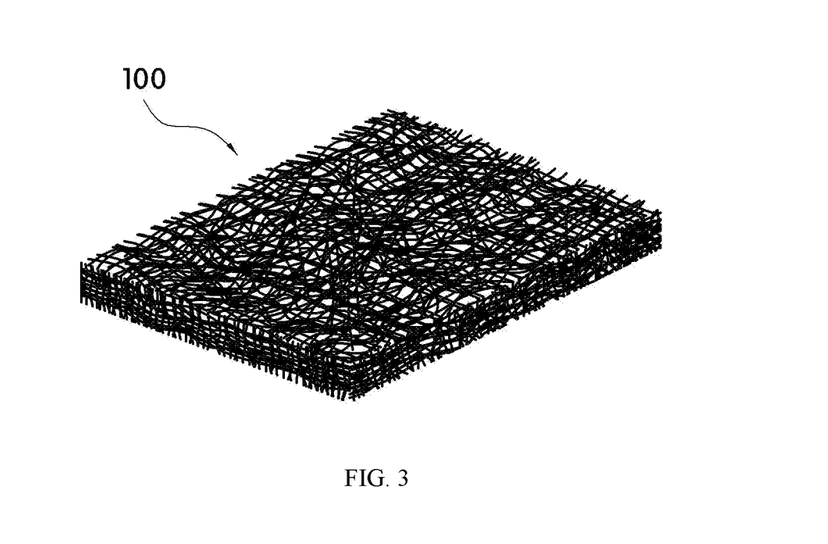
FIG. 3 is a sectional view schematically illustrating a quantum dot sheet according to one embodiment of the present disclosure.

Referring to FIG. 3, according to one exemplary embodiment of the present disclosure, a quantum dot sheet 100 has a nano-fibrous aggregate having a three-dimensional network structure.

Figure 4:
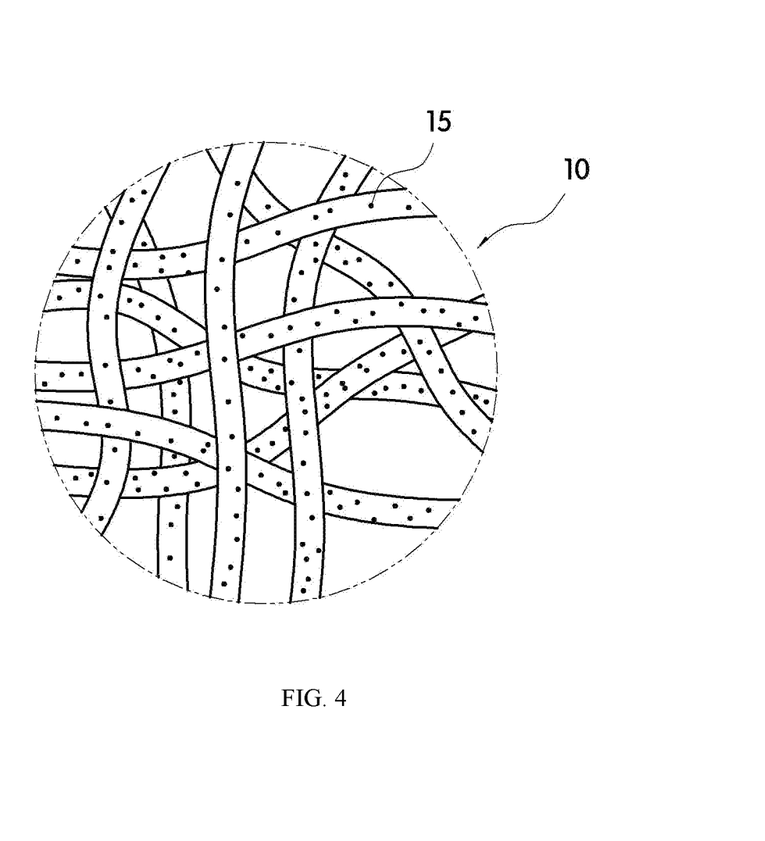
FIG. 4 is a schematic enlarged view illustrating nanofibers forming a three-dimensional network structure in the quantum dot sheet.

In addition, as shown in FIG. 4, nanofibers constituting the quantum dot sheet 100 include quantum dots 15, and the quantum dot sheet of the present disclosure has a fibrous-web structure in which the quantum dots may be uniformly dispersed, and degradation of the quantum dots may be decreased.

Figure 5:
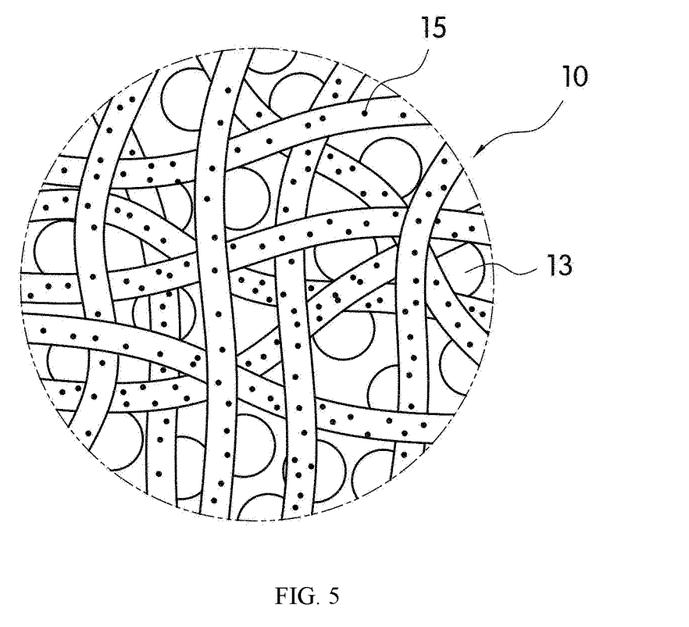
FIG. 5 is a schematic enlarged view illustrating the nanofibers forming the three-dimensional network structure in the quantum dot sheet and the quantum dot sheet in which a fluorescent substance is fixed by a nanofiber aggregate.

Referring to FIG. 5, the nanofibers constituting the quantum dot sheet 100 include the quantum dots 15, a fluorescent substance 13 is contained in the three-dimensional network structure formed by the nanofiber aggregate, and the fluorescent substance is fixed by the nanofiber aggregate, so that the fluorescent substance may be disposed inside the three-dimensional network structure.

Figure 6:
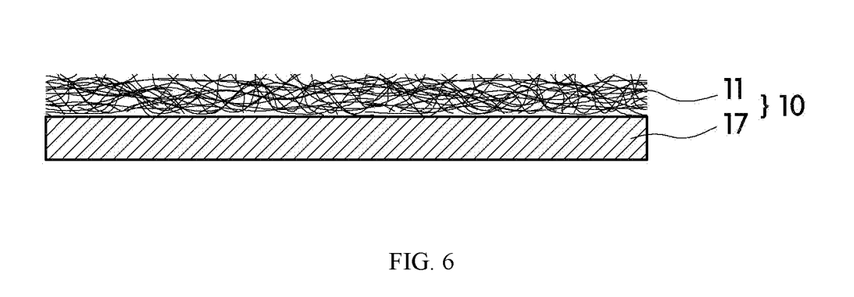
FIG. 6 is a sectional view schematically illustrating a quantum dot sheet according to another embodiment of the present disclosure.

Referring to FIG. 6, when viewed from a light transmission (or traveling) direction, the quantum dot sheet 100 may be formed by laminating a quantum dot layer 11 on one surface of a support layer 17 or a barrier layer, or the quantum dot sheet of the present disclosure may be peeled off from the support layer or the barrier layer such that the quantum dot sheet is formed only by the quantum dot layer (see FIG. 3). The quantum dot layer may have nanofibers densely formed so as to have no air gaps when viewed from the top.

Figure 7:
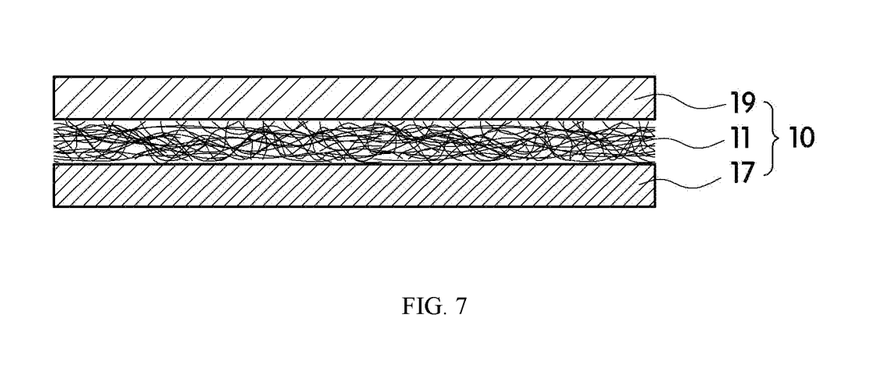
FIG. 7 is a sectional view schematically illustrating a quantum dot sheet according to still another embodiment of the present disclosure.

In addition, referring to FIG. 7, the quantum dot sheet 100 may be formed by laminating the barrier layer 19 on one or both surfaces of the quantum dot layer 11 to prevent the quantum dots in the nanofibers from being oxidized, or a surface of the nanofibers constituting the quantum dot layer may be coated with a barrier material to prevent the quantum dots from being oxidized.

Figure 8:
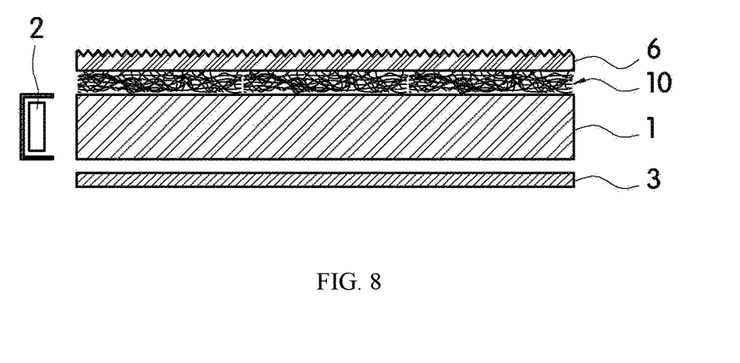
FIG. 8 is a schematic sectional view illustrating a backlight unit that adopts the quantum dot sheet of the present disclosure.

When light passes through the quantum dot sheet 100 of the present disclosure, the light is diffuse-reflected by the nanofibers constituting the quantum dot sheet, which provides a light diffusion effect, so that the quantum dot sheet may serve as a diffusion sheet, and thus a BLU without a diffusion sheet may be provided as schematically shown in FIG. 8. That is, a BLU in which the quantum dot sheet and the prism sheet are sequentially laminated on a top surface of a light guide plate may be provided. In addition, a reflective plate may be disposed on a bottom surface of the light guide plate of the BLU.

The present disclosure will be described in more detail through a description of a method of manufacturing a quantum dot sheet.

The quantum dot sheet of the present disclosure may be manufactured by performing: a first step of preparing a mixed solution including a quantum dot dispersion solution containing quantum dots, a polymer resin, and a solvent; a second step of forming an aggregate in which nanofibers are laminated by electrospinning or electrospraying the mixed solution; and a third step of heat-curing the aggregate in which the nanofibers are laminated to form a quantum dot layer having a three-dimensional network structure.

In addition, a fluorescent substance may be added into the mixed solution to form a quantum dot layer as shown in FIG. 5.

The quantum dot of the quantum dot dispersion solution is a particle in which a nano-sized II-IV group semiconductor particle serves as a core, and the fluorescence of the quantum dot is light generated when electrons, which are in an excited state, are transitioned from a conduction band to a valence band. In the present disclosure, the quantum dots may include at least one type of quantum dot selected from: a red-based quantum dot having a photoluminescence (PL) wavelength peak of 600 nm to 750 nm; a yellow-based quantum dot having a PL wavelength peak of 550 nm to 600 nm; and a green-based quantum dot having a PL wavelength peak of 490 nm to 530 nm, and preferably include at least two types of quantum dots selected from the same. More preferably, the red-based quantum dots and the green-based quantum dots may be mixed in a weight ratio of 1:2 to 1:4 to realize white light, or the red-based quantum dots and the yellow-based quantum dots may be mixed in a weight ratio of 1:0.8 to 1:2.5 to realize white light.

In addition, the quantum dots may be those generally used in the art. In detail, the quantum dots include II-VI group, III-V group, IV-VI group and IV group semiconductors, and the quantum dots in the present disclosure may include at least one selected from Si, Ge, Sn, Se, Te, B, C, P, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, $Cd_xSe_yS_z$, CdTe, HgS, HgSe, HgTe, BeS, BeSe, BeTe, MgS, MgSe, GeS, GeSe, GeTe, SnS, SnSe, SnTe, PbO, PbS, PbSe, PbTe, CuF, CuCl, $CuInS_2$, $Cu_2SnS_3$, CuBr, CuI, $Si_3N_4$, $Ge_3N_4$, $Al_2O_3$, $(Al, Ga, In)_2(S, Se, Te)_3$, CIGS, CGS, and $(ZnS)_y(Cu_xSn_{1-x}S_2)_{1-y}$, wherein $0<x<1$, and y is a rational number satisfying $0<y<1$. Further, the quantum dots may have a core/shell structure or an alloy structure. Non-limiting examples of quantum dots having the core/shell structure or the alloy structure include CdSe/ZnS, CdSe/ZnSe/ZnS, CdSe/CdS$_x$ (Zn$_{1-y}$Cd$_y$)S/ZnS, CdSe/CdS/ZnCdS/ZnS, InP/ZnS, InP/Ga/ZnS, InP/ZnSe/ZnS, PbSe/PbS, CdSe/CdS, CdSe/CdS/ZnS, CdTe/CdS, CdTe/ZnS, CuInS2/ZnS, Cu2SnS3/ZnS, etc. Specific examples of the quantum dots are described for the purpose of comprehension of the present disclosure, and the present disclosure is not limited to the above types of quantum dots.

In addition, the quantum dots have an average particle diameter of 1 nm to 50 nm, preferably 2 nm to 30 nm, and more preferably 2 nm to 20 nm. In this case, when the average particle diameter of the quantum dots exceeds 50 nm, quantum dots separated from the nanofibers may increase in number during electrospinning or electrospraying, so it is preferable to use quantum dots having an average particle diameter within the above range.

As a specific example, the red-based quantum dots are CdSe having an average particle diameter of 5.2 nm to 8 nm, and the green-based quantum dots are CdSe having an average particle diameter of 3 nm to 4.5 nm, and the red-based quantum dots and the green-based quantum dots may be mixed for use.

As another specific example, the red-based quantum dots are CuInS$_2$ having an average particle diameter of 4.5 nm to 5.2 nm, and the yellow-based quantum dots are CuInS$_2$ having an average particle diameter of 2.5 nm to 4.0 nm, and the red-based quantum dots and the yellow-based quantum dots may be mixed for use.

In addition, the quantum dot dispersion solution includes a solvent for uniform dispersion. For example, the solvent of the quantum dot dispersion solution may include one or two selected from toluene, formamide, dimethylsulfoxide, dimethylformamide, acetic acid, acetonitrile, methoxyethanol, tetrahydrofuran, benzene, xylene, cyclohexane, methanol, chloroform, and acetone.

Further, when a quantum dot layer as shown in FIG. 4 is formed, an amount of the quantum dots in the mixed solution may be 1 to 6 parts by weight, preferably 2 to 4 parts by weight based on 100 parts by weight of the polymer resin. In this case, it may be difficult to realize white light when the amount of the quantum dots is less than 1 part by weight, and it is uneconomical for the quantum dots to exceed 6 parts by weight, so it is preferable for the quantum dots to fall within the above range.

In addition, when a quantum dot layer shown in FIG. 5 is formed, the amount of the quantum dots in the mixed solution may be in the range of 0.5 to 5 parts by weight, preferably 0.8 to 3 parts by weight based on 100 parts by weight of the polymer resin. In this case, the amount of the fluorescent substance has to be increased to realize white light, and the color reproduction rate may be reduced when the amount of the quantum dots is less than 0.5 parts by weight. It is uneconomical for the quantum dots to exceed 5 parts by weight, so it is preferable for the quantum dots to fall within the above range.

The fluorescent substance may be a fluorescent substance generally used in the art, preferably one or at least two selected from among a silicate-based fluorescent substance, a sulfide-based fluorescent substance, a nitrate-based fluorescent substance, a nitride-based fluorescent substance, and an aluminate-based fluorescent substance.

For example, the fluorescent substance may be one or at least two selected from among (Sr, Ca)B$_4$O$_7$:Eu, BaMgAl$_{10}$O$_{17}$:Eu, Y$_2$O$_3$:Eu, InBO$_3$:Eu, YVO$_4$:Eu, YBO$_3$: Eu, (Y, Gd)BO$_3$:Eu, SrTiO$_3$:Eu, (Si, Al)$_6$(O, N)$_8$:Eu, Y$_2$O$_2$S: Eu, La$_2$O$_2$S:Eu, (La, Mn, Sm)$_2$O$_2$S.Ga$_2$O$_3$:Eu, (Ca, Sr)S:Eu, CaAlSiN$_3$:Eu, (Sr, Ca)AlSiN$_3$:Eu, Sr$_2$Si$_5$N$_8$:Eu, CaGa$_2$S$_4$: Eu, SrGa$_2$S$_4$:Eu, SrSi$_2$O$_2$N$_2$:Eu, BaGa$_2$S$_4$:Eu, SrAl$_2$O$_4$:Eu, BAM:Eu, (Ba, Sr, Ca)$_2$SiO$_4$:Eu, (Sr, Ba, Ca, Mg, Zn)$_2$Si(OD)$_4$:Eu (wherein D is F, Cl, S, N, or Br), β-SiAlON:Eu, Ba$_3$Si$_6$O$_{12}$N$_2$:Eu, Ba$_2$MgSi$_2$O$_7$:Eu, Mg$_2$SiO$_4$:Mn, Zn$_3$(PO$_4$)$_2$:Mn, (Y, Gd)BO$_3$:Tb, Ca$_3$(Sc, Mg)$_2$Si$_3$O$_{12}$:Ce, Y$_2$SiO$_5$:Ce, Ca$_3$Y$_2$Si$_6$O$_8$:Ce, BaAl$_{12}$O$_{19}$:Mn, Y$_3$Al$_5$O$_{12}$:Ce, Y$_3$Al$_5$O$_{12}$:Tb, Zn$_2$SiO$_4$:Mn, InBO$_3$:Tb, ZnS:Cu, and Ca$_{10}$(PO$_4$)$_6$Cl$_2$. Preferably, the red-based fluorescent substance may include at least one selected from among Y$_2$O$_2$S:Eu, La$_2$O$_2$S:Eu, (La, Mn, Sm)$_2$O$_2$S.Ga$_2$O$_3$:Eu, (Ca, Sr)S:Eu, CaAlSiN$_3$:Eu, (Sr, Ca)AlSiN$_3$:Eu, and Sr$_2$Si$_5$N$_8$:Eu, and the green-based fluorescent substance may include at least one selected from among CaGa$_2$S$_4$:Eu, SrGa$_2$S$_4$:Eu, SrSi$_2$O$_2$N$_2$: Eu, BaGa$_2$S$_4$:Eu, SrAl$_2$O$_4$:Eu, BAM:Eu, (Ba, Sr, Ca)$_2$SiO$_4$: Eu, (Sr, Ba, Ca, Mg, Zn)$_2$Si(OD)$_4$:Eu (wherein D is F, Cl, S, N, or Br), β-SiAlON:Eu, Ba$_3$Si$_6$O$_{12}$N$_2$:Eu, Ba$_2$MgSi$_2$O$_7$: Eu, and Ca$_3$(Sc, Mg)$_2$Si$_3$O$_{12}$:Ce.

In addition, the fluorescent substance has an average particle diameter of 2,000 nm to 30,000 nm, preferably 5,000 nm to 25,000 nm, and more preferably 6,000 nm to 16,000 nm. In this case, when the average particle diameter of the fluorescent substance exceeds 30,000 nm, since the particle diameter is too large, it is difficult for the fluorescent substance to be fixed by the nanofibers after the electrospinning or electrospraying, such that the fluorescent substance may be separated from the quantum dot layer, so it is preferable to use a fluorescent substance having an average particle diameter within the above range.

In this case, an amount of the fluorescent substance may be in the range of 10 to 20 parts by weight, preferably 12 to 18 parts by weight based on 100 parts by weight of the polymer resin. In this case, a wavelength may be insufficient to realize white light when the amount of the fluorescent substance is less than 10 parts by weight, and dispersibility may be decreased when the amount of the fluorescent substance exceeds 20 parts by weight.

In addition, the quantum dots and the fluorescent substance are adjusted to be in a weight ratio of 1:10 to 1:40, preferably 1:10 to 1:25, and more preferably 1:12 to 1:20 by weight, which is advantageous in terms of ensuring high color reproducibility. For example, the quantum dots may be the red-based quantum dots, and the fluorescent substance may be at least one selected from the green-based fluorescent substance and the yellow-based fluorescent substance.

Alternatively, the quantum dots may be at least one selected from the green-based quantum dots and the yellow-based quantum dots, and the fluorescent substance may be the red-based fluorescent substance.

The polymer resin prepared in the first step may include one or a mixture of at least two selected from among polyethyleneterephthalate resin, polycarbonate resin, polyalkylmethacrylate resin, polymethacrylate resin, polyvinylidene fluoride resin, polystyrene resin, polyvinyl chloride resin, styrene acrylonitrile copolymer resin, polyurethane resin, polyamide resin, polyvinyl butyral resin, silicone resin, polyvinyl acetate resin, and unsaturated polyester resin. Preferably, the polymer resin prepared in the first step may include one or a mixture of at least two selected from among polyethyleneterephthalate resin, polycarbonate resin, polyalkylmethacrylate resin, and polyvinylidene fluoride resin having excellent transparency. For example, polyalkylmethacrylate resin and polyvinylidene fluoride resin may be mixed in a weight ratio of 5 to 7:3 to 5.

The solvent of the mixed solution prepared in the first step dissolves the polymer resin, and may be a solvent generally used in the art. An amount of the solvent is 500 to 20,000 parts by weight, preferably 600 to 5,000 parts by weight, and more preferably 650 to 1,500 parts by weight based on 100 parts by weight of the polymer resin, which is preferable in terms of maintaining a viscosity appropriate for electrospinning or electrospraying the mixed solution. The solvent of the mixed solution may be one or a mixture of at least two selected from among dim ethyl sulfoxide, dimethylformamide, dimethylacetamide, acetone, toluene, formamide, acetic acid, acetonitrile, methoxyethanol, tetrahydrofuran, benzene, xylene, and cyclohexane.

The second step is forming the nanofibers and the aggregate of the nanofibers by electrospinning or electrospraying the mixed solution prepared in the first step. In the forming of the nanofibers and the aggregate of the nanofibers, electrospinning is preferred when the mixed solution has a high concentration (high viscosity), and electrospraying is preferred when the mixed solution has a low concentration (low viscosity).

In the second step, a two-layer structure (support layer-quantum dot layer or barrier layer-quantum dot layer) may be formed by electrospinning or electrospraying the mixed solution on a top surface of the support layer or the barrier layer. In this case, the support layer or the barrier layer may be formed of one or a mixture of at least two selected from among polyethyleneterephthalate resin, polycarbonate resin, polyalkylmethacrylate resin, polymethacrylate resin, polyvinylidene fluoride resin, polystyrene resin, polyvinyl chloride resin, styrene acrylonitrile copolymer resin, polyurethane resin, polyamide resin, polyvinyl butyral resin, silicone resin, polyvinyl acetate resin, and unsaturated polyester resin. Preferably, the support layer or the barrier layer may be formed of one or a mixture of at least two selected from polyethyleneterephthalate resin, polycarbonate resin, polyalkylmethacrylate resin, polymethacrylate resin, and polyvinylidene fluoride resin. When the quantum dot sheet has a structure including two layers or more, bonding strength with the quantum dot layer may be improved by using the same polymer resin as the mixed solution.

Electrospinning or electrospraying is performed in the second step such that the nanofiber has an average particle diameter of 200 nm to 1,000 nm, preferably 200 nm to 800 nm, and more preferably 250 nm to 600 nm. Here, there may be a problem in shape stability and the quantum dots may protrude when the average particle diameter of the nanofibers is 200 nm, which is too small. When the average particle diameter exceeds 1,000 nm, a diffuse reflection effect of light may be reduced.

In addition, to form the aggregate of laminated nanofibers having a barrier coating layer, a barrier material may be spin-coated or spray-coated on a surface of the nanofibers formed by the electrospinning or electrospraying in the second step.

The third step is drying the aggregate of nanofibers laminated in the second step to form the quantum dot layer having the three-dimensional network structure. The quantum dot layer may have an average thickness of 3 μm to 100 μm, preferably 3 μm to 60 μm, and more preferably 3 μm to 50 μm.

In addition, drying is performed to remove the remaining solvent and additionally enhance adhesion in a bonding region between the nanofibers. A drying temperature may be variously selected based on the types of the solvent and the polymer resin, and it is preferred to perform the drying using a method such as hot air drying by applying heat having a temperature of 30° C. to 60° C.

Further, the method of manufacturing the quantum dot sheet may further include a fourth step of laminating the barrier layer on one surface of the quantum dot layer.

In this case, the barrier layer formed in the fourth step may be formed of one or a mixture of at least two selected from polycarbonate resin, polymethacrylate resin, and polyvinylidene fluoride resin, preferably the same resin as the polymer resin prepared in the first step to improve the bonding strength between the quantum dot layer and the barrier film (or a coating layer).

In addition, a step of separating the quantum dot layer from the support layer formed at a bottom of the quantum dot layer is performed after the third step or the fourth step to manufacture a quantum dot sheet having a single-layer structure including only the quantum dot layer as shown in FIG. 3, or to manufacture a quantum dot sheet having a two-layer structure in which a barrier layer is laminated on one surface of the quantum dot layer.

Figure 9:
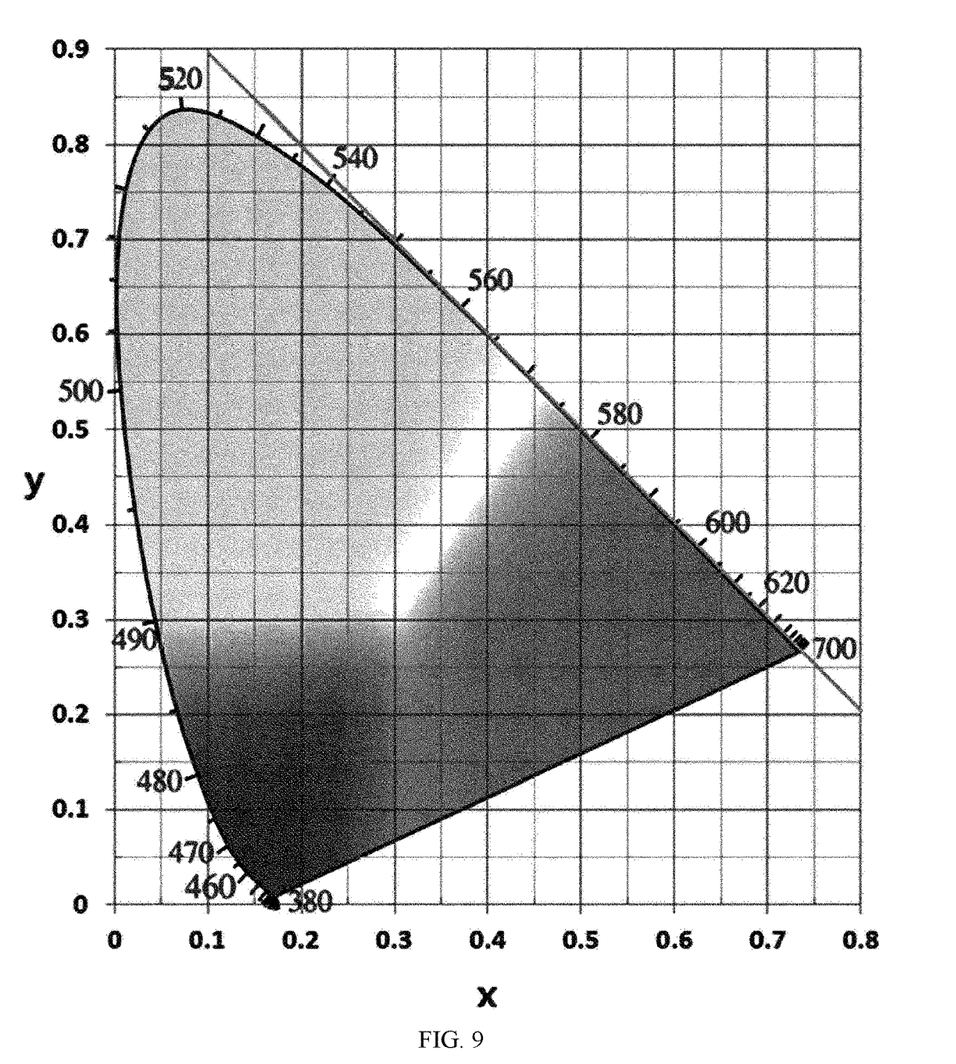
FIG. 9 illustrates a CIE 1931 color coordinate system.

In the above quantum dot sheet having the fibrous-web structure according to the present disclosure, when a color coordinate of an area of 1.5 mmØ in the quantum dot sheet is measured (see CIE 1931 color coordinates in FIG. 9) using a color coordinate system measurement device under conditions in which a distance between a blue light source and the quantum dot sheet is 0.5 m and a measurement angle is 0.2°, a CIE x value and a CIE y value may satisfy color coordinate values of the following Expressions 1 and 2:

$0.23 \leq \text{CIE } x \leq 0.37$, preferably $0.25 \leq \text{CIE } x \leq 0.35$, and more preferably $0.26 \leq \text{CIE } x \leq 0.32$; and    [Expression 1]

$0.28 \leq \text{CIE } y \leq 0.42$, preferably $0.30 \leq \text{CIE } y \leq 0.40$, and more preferably $0.30 \leq \text{CIE } y \leq 0.37$.    [Expression 2]

In addition, according to the present disclosure, the quantum dot sheet as shown in FIG. 4 has a high color reproduction rate of 100% or more, preferably 105% or more on the basis of a 100% NTSC color gamut based on CIE 1931 color coordinates, so that the quantum dot sheet may have superior color reproducibility. Further, the quantum dot sheet may have a high luminance of 5,200 cd/m² or more, preferably 5,500 cd/m² or more.

Moreover, according to the present disclosure, when the quantum dots and the fluorescent substances are adopted as shown in FIG. 5, the quantum dot sheet has a high color reproduction rate of 100% or more, preferably 102% or more, and more preferably 103% or more on the basis of the 100% NTSC color gamut based on the CIE 1931 color coordinates, so that the quantum dot sheet may have superior color reproducibility. In addition, the quantum dot sheet may have a high luminance of 4,600 cd/m² or more, preferably 4,800 cd/m² or more, and more preferably 4,850 cd/m² to 6,000 cd/m².

Hereinafter, the present disclosure will be described in more detail based on examples. However, the following examples are described for the purpose of comprehension of the present disclosure, and should not be construed as limiting the scope of the present disclosure by the following examples.

EXAMPLES

Preparation Example 1-1: Preparation of Red-Based Quantum Dot Dispersion Solution A quantum dot dispersion solution of CdSe having a PL wavelength peak of 650 nm to 660 nm and an average particle diameter of 5.8 nm to 6.1 nm dispersed in a toluene solvent was prepared.

Preparation Example 1-2: Preparation of Red-Based Quantum Dot Dispersion Solution A quantum dot dispersion solution of $CuInS_2$ having a PL wavelength peak of 695 nm to 710 nm and an average particle diameter of 4.8 nm to 5.0 nm dispersed in an acetone solvent was prepared.

Preparation Example 2-1: Preparation of Green-Based Quantum Dot

A quantum dot dispersion solution of CdSe having a PL wavelength peak of 505 nm to 510 nm and an average particle diameter of 3.9 nm to 4.1 nm dispersed in a toluene solvent was prepared.

Preparation Example 2-2: Preparation of Yellow-based Quantum Dot

A quantum dot dispersion solution of $CuInS_2$ having a PL wavelength peak of 550 nm to 560 nm and an average particle diameter of 2.8 nm to 3.0 nm dispersed in an acetone solvent was prepared.

Preparation Example 3: Preparation of Green-Based Fluorescent Substance

A $Ba_2MgSi_2O_7$:Eu fluorescent powder having an average particle diameter of 8,215 nm was prepared.

Example 1-1

A polymer resin containing a polyvinylidene fluoride (PVDF) resin and a polymethyl methacrylate (PMMA) resin in a weight ratio of 6:4, the quantum dot dispersion solution prepared in Preparation Example 1-1 and Preparation Example 2-1, and a dimethylacetamide solvent were mixed and agitated to prepare a mixed solution.

In this case, the mixing ratio was 1.2 parts by weight of red-based quantum dots in the red-based dispersion solution, 2.8 parts by weight of green-based quantum dots in the green-based dispersion solution, and 934 parts by weight of the solvent based on 100 parts by weight of the polymer resin.

The mixed solution was electrospun on a PET film, which was a support, and dried with hot air at 45° C. to 48° C. to form a quantum dot layer having an average thickness of 24 μm.

Next, the quantum dot layer was peeled off from the PET film, which was the support, to manufacture the quantum dot sheet having the fibrous-web structure including a single layer as shown in FIG. 3.

At this time, the average particle diameter of the nanofibers constituting the quantum dot layer of the quantum dot sheet was in the range of 290 nm to 300 nm.

Experimental Example 1: Measurement of Color Coordinates, Color Reproduction Rate, and Luminance The quantum dot sheet formed in Example 1-1 was used to measure a color coordinate of an area of 1.5 mmØ in the quantum dot sheet, color reproduction rate, and luminance on the basis of a 100% NTSC color gamut (based on CIE 1931 color coordinates; see FIG. 9) by using a color coordinate system measurement device (BM-7 of Topcon) under conditions in which a distance between a blue light source (having intensity of 500 W) and the quantum dot sheet was 0.5 m, and a measurement angle was 0.2°. In order to increase the accuracy of measurement results, the analysis was performed five times, and an average value was calculated. The results are shown in Table 1 below.

TABLE 1

| Classification | Color coordinates | | Color reproduction rate | Luminance (cd/m$^2$) |
| --- | --- | --- | --- | --- |
| | CIE x | CIE y | | |
| First time | 0.2702 | 0.3002 | 105.8% | 5,635 |
| Second time | 0.2710 | 0.3011 | 106.5% | 5,692 |
| Third time | 0.2700 | 0.3004 | 106.3% | 5,595 |
| Fourth time | 0.2694 | 0.3004 | 105.0% | 5,709 |
| Fifth time | 0.2711 | 0.3006 | 105.6% | 5,684 |
| Average | 0.2703 | 0.3006 | 105.8% | 5,663 |

Referring to the experimental results shown in Table 1, according to the present disclosure, the quantum dot sheet including only the quantum dot layer of Example 1-1 had color coordinates of CIE x=0.2703, and CIE y=0.3006, and it was found that the blue light source realized white light through the CIE 1931 color coordinates shown in FIG. 9. In addition, it was found that the quantum dot sheet had a very high color reproduction rate of 105.8% and a high luminance of 5,500 cd/m$^2$ or more.

Example 1-2

The polymer resin containing the PVDF resin and the PMMA resin in the weight ratio of 6:4, the quantum dot dispersion solution prepared in Preparation Example 1-2 and Preparation Example 2-2, and the dimethylacetamide solvent were mixed and agitated to prepare a mixed solution.

In this case, the mixing ratio was 1.4 parts by weight of red-based quantum dots in the red-based dispersion solution, 1.75 parts by weight of yellow-based quantum dots in the yellow-based dispersion solution, and 932 parts by weight of the solvent based on 100 parts by weight of the polymer resin.

The mixed solution was electrospun on a PET film, which was the support, and dried with hot air at 45° C. to 48° C. to form a quantum dot layer having an average thickness of 22 μm to 23 μm.

Next, the quantum dot layer was peeled off from the PET film, which was the support, to manufacture the quantum dot sheet having the fibrous-web structure including a single layer as shown in FIG. 3.

At this time, the average particle diameter of the nanofibers constituting the quantum dot layer of the quantum dot sheet was in the range of 275 nm to 285 nm.

Example 1-3

A quantum dot sheet having the fibrous-web structure including a single layer was manufactured in the same manner as in Example 1-2, except that the average thickness of the quantum dot layer was in the range of 46 μm to 48 μm.

Example 1-4

A quantum dot sheet having the fibrous-web structure including a single layer was manufactured in the same manner as in Example 1-2, except that the average thickness of the quantum dot layer was in the range of 46 μm to 48 μm. Here, the average particle diameter of the nanofibers constituting the quantum dot layer of the quantum dot sheet was in the range of 560 nm to 570 nm.

Comparative Example 1-1: Manufacture of Quantum Dot Sheet

The polymer resin containing the PVDF resin and the PMMA resin in the weight ratio of 6:4, the quantum dot dispersion solution prepared in Preparation Example 1-2 and Preparation Example 2-2, and the dimethylacetamide solvent were mixed and agitated to prepare a mixed solution.

In this case, the mixing ratio was 1.4 parts by weight of red-based quantum dots in the red-based dispersion solution, 1.8 parts by weight of yellow-based quantum dots in the yellow-based dispersion solution, and 820 parts by weight of the solvent based on 100 parts by weight of the polymer resin.

The mixed solution was comma-coated on a PET film, which was the support, and dried with hot air at 70° C. to 72° C. to form a quantum dot layer having a film form and an average thickness of 22.6 μm.

Next, the quantum dot layer was peeled off from the PET film, which was the support, to manufacture a sheet-type quantum dot sheet.

Comparative Example 1-2

A quantum dot sheet having the fibrous-web structure including a single layer was manufactured in the same manner as in Example 1-4, except that the average thickness of the quantum dot layer was 46 μm to 48 μm. Here, the average particle diameter of the nanofibers constituting the quantum dot layer of the quantum dot sheet was in the range of 1,072 nm to 1,075 nm.

Comparative Example 1-3

A quantum dot sheet (having an average thickness of 22 μm to 23 μm) having the fibrous-web structure including a single layer was formed in the same manner as in Example 1-2, except that a mixed solution (spinning solution) used for the electrospinning was prepared so as to include 3.2 parts by weight of red-based quantum dots in the red-based dispersion solution, 4.2 parts by weight of yellow-based quantum dots in the yellow-based dispersion solution, and 932 parts by weight of the solvent based on 100 parts by weight of the polymer resin, and used to manufacture the quantum dot sheet.

Comparative Example 1-4

A quantum dot sheet (having an average thickness of 22 μm to 23 μm) having the fibrous-web structure including a single layer was prepared in the same manner as in Example 1-2, except that a mixed solution (spinning solution) used for the electrospinning was prepared so as to include 0.8 parts by weight of red-based quantum dots in the red-based dispersion solution, 3 parts by weight of yellow-based quantum dots in the yellow-based dispersion solution, and 932 parts by weight of the solvent based on 100 parts by weight of the polymer resin, and used to manufacture the quantum dot sheet.

Experimental Example 2: Measurement of Color Coordinates, Color Reproduction Rate, and Luminance The color coordinate, the color reproduction rate, and the luminance were measured in the same manner as in Experimental Example 1 using the quantum dot sheets formed in Examples 1-2 to 1-4 and Comparative Examples 1-1 to 1-4, and the results are shown in Table 2 below. At this time, each measurement value represents an average value obtained after measuring five times.

TABLE 2

| Classification | Color coordinates | | Color reproduction rate | Luminance (cd/m$^2$) |
| --- | --- | --- | --- | --- |
| | CIE x | CIE y | | |
| Example 1-2 | 0.2842 | 0.3327 | 105.2% | 5,574 |
| Example 1-3 | 0.2819 | 0.3253 | 105.4% | 5,626 |
| Example 1-4 | 0.2822 | 0.3246 | 105.3% | 5,637 |
| Comparative Example 1-1 | 0.3053 | 0.3489 | 99.4% | 5,026 |
| Comparative Example 1-2 | 0.2907 | 0.3280 | 104.7% | 5,191 |
| Comparative Example 1-3 | 0.2801 | 0.3358 | 105.4% | 5,595 |
| Comparative Example 1-4 | 0.3523 | 0.3967 | 103.2% | 5,426 |

In Examples 1-2 to 1-4, it was found that the color coordinates satisfied 0.26≤CIE x≤0.32 and 0.30≤CIE y≤0.37 to realize white light, and the color reproduction rate was 105% or more. In particular, the color reproduction rate of non-cadmium-based quantum dots tended to be slightly lower than the color reproduction rate of cadmium-based quantum dots. Comparing the color reproduction rates of Comparative Example 1-1 of a coating film (or a film membrane) with Example 1-2, it was found that the quantum dot sheet manufactured to have the fibrous-web structure obtained an effect of enhanced color reproduction rate.

In the case of Comparative Example 1-2 in which the average particle diameter of the nanofibers exceeded 1,000 nm, when compared with Example 1-4, there was no significant influence on the color coordinates and the color reproduction rate, whereas the luminance significantly decreased to less than 5,200 cd/m$^2$, and it was determined that the luminance decreased because the diffuse reflection effect of light decreased.

In the case of Comparative Example 1-3 in which more than 6 parts by weight of quantum dots were used based on 100 parts by weight of the polymer resin, when compared with Example 1-2, there was almost no difference in the color reproduction rate and a luminance enhancement effect, and thus it was found that a large number of quantum dots is unnecessary.

In the case of Comparative Example 1-4 in which more than 2.5 weight parts of the yellow-based quantum dots were used relative to the red-based quantum dots, a CIE x value exceeded 0.32 and a CIE y value exceeded 0.37, which made it difficult to realize white light, such that the color reproduction rate and the luminance tended to be lower when compared with Example 2.

Example 2-1

The polymer resin containing the PVDF resin and the PMMA resin in the weight ratio of 6:4, the quantum dot dispersion solution prepared in Preparation Example 1-1, a fluorescent substance prepared in Preparation Example 3, and the dimethylacetamide solvent were mixed and agitated to prepare a mixed solution.

In this case, the mixing ratio was 1 part by weight of red-based quantum dots in the red-based dispersion solution, 15 parts by weight of the green-based fluorescent substance, and 960 parts by weight of the solvent based on 100 parts by weight of the polymer resin.

The mixed solution was electrospun on a PET film, which was the support, and dried with hot air at 45° C. to 48° C. to form a quantum dot layer having an average thickness of 72 μm to 73 μm.

Next, the quantum dot layer was peeled off from the PET film, which was the support, to manufacture the quantum dot sheet having the fibrous-web structure including a single layer as shown in FIGS. 3 and 4.

At this time, the average particle diameter of the nanofibers constituting the quantum dot layer of the quantum dot sheet was 295 nm to 300 nm.

Experimental Example 3: Measurement of Color Coordinates, Color Reproduction Rate, and Luminance The color coordinate, the color reproduction rate, and the luminance were measured in the same manner as in Experimental Example 1 using the quantum dot sheet formed in Example 2-1, and the results are shown in Table 3 below. At this time, each measurement value represents an average value obtained after measuring five times.

TABLE 3

| Classification | Color coordinates | | Color reproduction rate | Luminance (cd/m$^2$) |
| --- | --- | --- | --- | --- |
| | CIE x | CIE y | | |
| First time | 0.2671 | 0.3088 | 102.5% | 4,866 |
| Second time | 0.2680 | 0.3091 | 102.6% | 4,890 |
| Third time | 0.2689 | 0.3094 | 102.7% | 4,904 |
| Fourth time | 0.2678 | 0.3093 | 102.5% | 4,870 |
| Fifth time | 0.2689 | 0.3095 | 102.6% | 4,870 |
| Average | 0.2681 | 0.3092 | 102.6% | 4,880 |

Referring to the experimental results shown in Table 3, according to the present disclosure, the quantum dot sheet including only the quantum dot layer of Example 2-1 had color coordinates of CIE x=0.2681, and CIE y=0.3092, and it was found that the blue light source realized white light through the CIE 1931 color coordinates shown in FIG. 9. In addition, it was found that the quantum dot sheet had a very high color reproduction rate of 102.6%, and a high luminance of 4,800 cd/m$^2$ or more.

Example 2-2

The polymer resin containing the PVDF resin and the PMMA resin in the weight ratio of 6:4, the quantum dot dispersion solution prepared in Preparation Example 1-2, the fluorescent substance prepared in Preparation Example 3, and the dimethylacetamide solvent were mixed and agitated to prepare a mixed solution.

In this case, the mixing ratio was 1.2 parts by weight of red-based quantum dots in the red-based dispersion solution, 15 parts by weight of the green-based fluorescent substance, and 960 parts by weight of the solvent based on 100 parts by weight of the polymer resin.

The mixed solution was electrospun on a PET film, which was the support, and dried with hot air at 45° C. to 48° C. to form a quantum dot layer having an average thickness of 86 μm to 87 μm.

Next, the quantum dot layer was peeled off from the PET film, which was the support, to manufacture the quantum dot sheet having the fibrous-web structure including a single layer as shown in FIGS. 3 and 4.

At this time, the average particle diameter of the nanofibers constituting the quantum dot layer of the quantum dot sheet was in the range of 285 nm to 290 nm.

Example 2-3

A quantum dot sheet was manufactured in the same manner as in Example 2-2, except that the mixed solution was prepared so as to include 1.2 parts by weight of red-based quantum dots in the red-based dispersion solution, 20 parts by weight of the green-based fluorescent substance, and 960 parts by weight of the solvent based on 100 parts by weight of the polymer resin.

Example 2-4

A quantum dot sheet was manufactured in the same manner as in Example 2-2, except that the mixed solution was prepared so as to include 1.2 parts by weight of red-based quantum dots in the red-based dispersion solution, 30 parts by weight of the green-based fluorescent substance, and 960 parts by weight of the solvent based on 100 parts by weight of the polymer resin.

Example 2-5

A quantum dot sheet having the fibrous-web structure including a single layer was manufactured in the same manner as in Example 2-2, except that the average thickness of the quantum dot layer was 89 μm to 90 μm. At this time, the average particle diameter of the nanofibers constituting the quantum dot layer of the quantum dot sheet was in the range of 585 nm to 595 nm.

Comparative Example 2-1

The mixed solution prepared in Example 2-2 was comma-coated on a PET film, which was the support, and dried with hot air at 70° C. to 72° C. to form a quantum dot layer having a film form and an average thickness of 22.6 μm.

Next, the quantum dot layer was peeled off from the PET film, which was the support, to manufacture a sheet-type quantum dot sheet.

Comparative Example 2-2

A quantum dot sheet was manufactured in the same manner as in Example 2-2, except that the mixed solution was prepared so as to include 1.2 parts by weight of red-based quantum dots in the red-based dispersion solution, 45 parts by weight of the green-based fluorescent substance, and 960 parts by weight of the solvent based on 100 parts by weight of the polymer resin.

Comparative Example 2-3

A quantum dot sheet was manufactured in the same manner as in Example 2-2, except that the mixed solution was prepared so as to include 1.2 parts by weight of red-based quantum dots in the red-based dispersion solution, 8 parts by weight of the green-based fluorescent substance, and 960 parts by weight of the solvent based on 100 parts by weight of the polymer resin.

Comparative Example 2-4

A quantum dot sheet having the fibrous-web structure including a single layer was manufactured in the same manner as in Example 2-2, except that the average thickness of the quantum dot layer was 89 μm to 90 μm. At this time, the average particle diameter of the nanofibers constituting the quantum dot layer of the quantum dot sheet was in the range of 1,050 nm to 1,060 nm.

Experimental Example 4: Measurement of Color Coordinates, Color Reproduction Rate, and Luminance The color coordinate, the color reproduction rate, and the luminance were measured in the same manner as in Experimental Example 1 using the quantum dot sheets formed in Examples 2-2 to 2-5 and Comparative Examples 2-1 to 2-4, and the results are shown in Table 4 below. At this time, each measurement value represents an average value obtained after measuring five times.

TABLE 4

| Classification | Color coordinates CIE x | Color coordinates CIE y | Color reproduction rate | Luminance (cd/m$^2$) |
| --- | --- | --- | --- | --- |
| Example 2-2 | 0.2959 | 0.3123 | 102.3% | 4,957 |
| Example 2-3 | 0.2955 | 0.3312 | 102.9% | 4,950 |
| Example 2-4 | 0.2956 | 0.3524 | 103.6% | 4,926 |
| Example 2-5 | 0.2962 | 0.3132 | 102.1% | 4,857 |
| Comparative Example 2-1 | 0.2894 | 0.3256 | 99.1% | 4,438 |
| Comparative Example 2-2 | 0.2961 | 0.3827 | 100.6% | 4,786 |
| Comparative Example 2-3 | 0.2967 | 0.2893 | 100.8% | 4,755 |
| Comparative Example 2-4 | 0.2952 | 0.3135 | 101.5% | 4,596 |

Referring to the experimental results shown in Table 4, in Examples 2-2 to 2-5, it was found that the color coordinates satisfied 0.26≤CIE x≤0.32 and 0.30≤CIE y≤0.37 to realize white light, and the color reproduction rate was 100% or more. In particular, the color reproduction rate of the non-cadmium-based quantum dots tended to be slightly lower than the color reproduction rate of the cadmium-based quantum dots. Comparing the color reproduction rates of Comparative Example 2-1 of a coating film (or a film membrane) with Example 2-2, it was found that the quantum dot sheet manufactured to have the fibrous-web structure obtained an effect of enhanced color reproduction rate.

In the case of Comparative Example 2-2 in which more than 40 parts by weight of the fluorescent substance were used and Comparative Example 2-3 in which less than 10 parts by weight of the fluorescent substance were used, the CIE y value exceeded 0.37, which made it difficult to realize white light, so that the color reproduction rate and the luminance tended to be lower when compared with Example 2-4.

In the case of Comparative Example 2-4 in which the average particle diameter of the nanofibers exceeded 1,000 nm, when compared with Example 2-4, there was no significant influence on the color coordinates and the color reproduction rate, whereas the luminance significantly decreased to less than 4,600 cd/m$^2$, and it was determined that the luminance decreased because the diffuse reflection effect of light decreased.

In the above examples and experimental examples, the BLU to which the quantum dot sheet of the present disclosure is applied may transmit light of high luminance to the prism sheet without using the diffusion sheet, so that a BLU having a volume (and/or a thickness) reduced as much as the volume (and/or a thickness) of the diffusion sheet may be provided, and the BLU may be applied to an LCD, an LED display, and an LED lighting device requiring high color reproducibility. In addition, since the quantum dot sheet of the present disclosure has the fibrous-web structure, the quantum dot sheet has excellent flexibility, so that the quantum dot sheet can be applied to a flexible display, a flexible lighting device, or the like.

The invention claimed is:

1. A quantum dot sheet having a fibrous-web structure, including a quantum dot layer with an average thickness of 3 μm to 100 μm having a three-dimensional network structure formed by an aggregate of nanofibers with an average particle diameter of 200 nm to 1,000 nm,
   wherein the nanofibers include 1 to 6 parts by weight of quantum dots with an average particle diameter of 1 nm to 50 nm based on 100 parts by weight of a polymer resin,
   wherein the polymer resin includes polyvinylidene fluoride and polyalkylmethacrylate in a ratio of 3 to 5:5 to 7 by weight,
   wherein the quantum dot layer includes red-based quantum dots and yellow-based quantum dots in a ratio of 1:0.8 to 2.5 by weight,
   wherein the red-based quantum dots have a photoluminescence (PL) wavelength peak of 600 nm to 750 nm and the yellow-based quantum dots have a PL wavelength peak of 550 nm to 600 nm,
   wherein, when a color coordinate for an area of 1.5 mmØ in the quantum dot sheet is measured using a color coordinate system measurement device where under conditions in which a distance between a blue light source and the quantum dot sheet is 0.5 m and a measurement angle is 0.2°, a CIE x color coordinate value ranges from 0.26 to 0.32 and a CIE y color coordinate value ranges from 0.30 to 0.37,
   wherein the quantum dot sheet has a color reproduction rate of 105% or more and a luminance of 5,500 cd/m$^2$ or more on the basis of a 100% NTSC color gamut based on CIE 1931 color coordinates.

2. The quantum dot sheet of claim 1, wherein the nanofibers further include a fluorescent substance in the three-dimensional network structure.

3. The quantum dot sheet of claim 2, wherein the quantum dot layer is formed to have the three-dimensional network structure by forming the aggregate in which the nanofibers are laminated by electrospinning or electrospraying a mixed solution including the quantum dots, a fluorescent substance, and the polymer resin; and
   the mixed solution includes the quantum dots and the fluorescent substance in a weight ratio of 1:10 to 1:40.

4. The quantum dot sheet of claim 2, wherein the fluorescent substance has an average particle diameter of 2,000 nm to 30,000 nm; and
the fluorescent substance includes at least one selected from the group consisting of a silicate-based fluorescent substance, a sulfide-based fluorescent substance, a nitrate-based fluorescent substance, a nitride-based fluorescent substance, and an aluminate-based fluorescent substance.

5. The quantum dot sheet of claim 2, wherein the quantum dots include red-based quantum dots; and
the fluorescent substance includes at least one selected from the group consisting of a green-based fluorescent substance and a yellow-based fluorescent substance.

6. The quantum dot sheet of claim 1, further comprising a support layer or a barrier layer disposed downstream of the quantum dot layer when viewed from a light transmission direction.

7. The quantum dot sheet of claim 6, further comprising a barrier layer disposed upstream of the quantum dot layer when viewed from the light transmission direction.

8. The quantum dot sheet of claim 1, wherein the nanofibers are coated with a barrier material.

9. A backlight unit comprising a quantum dot sheet of claim 1,
wherein the quantum dot sheet comprises a quantum dot layer having a three-dimensional network structure formed by an aggregate of nanofibers,
wherein the nanofibers include quantum dots.

10. A method of manufacturing the quantum dot sheet of claim 1, the method comprising:
a first step of preparing a mixed solution including a quantum dot dispersion solution containing quantum dots, a polymer resin, and a solvent;
a second step of forming an aggregate in which nanofibers are laminated by electrospinning or electrospraying the mixed solution on a top surface of a support layer or a barrier layer; and
a third step of drying the aggregate in which the nanofibers are laminated to form a quantum dot layer having a three-dimensional network structure.

11. The method of claim 10, wherein the mixed solution further includes a fluorescent substance.

12. The method of claim 10, further comprising a fourth step of laminating a barrier layer on one surface of the quantum dot layer formed in the third step.

13. The method of claim 10, further comprising separating the quantum dot layer formed in the third step from the support layer or the barrier layer.

* * * * *